United States Patent [19]
Yoshizawa

[11] 3,943,014
[45] Mar. 9, 1976

[54] PROCESS FOR THE FABRICATION OF SILICON TRANSISTORS WITH HIGH DC CURRENT GAIN

[75] Inventor: Yutaka Yoshizawa, Niiza, Japan

[73] Assignee: Sanken Electric Company Limited, Japan

[22] Filed: Jan. 31, 1975

[21] Appl. No.: 546,126

[30] Foreign Application Priority Data

| Feb. 7, 1974 | Japan | 49-16092 |
| Feb. 8, 1974 | Japan | 49-15919 |
| Feb. 22, 1974 | Japan | 49-21211 |
| Mar. 9, 1974 | Japan | 49-27573 |

[52] U.S. Cl. .................. 148/187; 148/1.5; 357/34; 357/63; 156/17
[51] Int. Cl.² ........................................ H01L 21/223
[58] Field of Search ........... 148/1.5, 187; 357/7, 34, 357/63; 156/17

[56] References Cited
UNITED STATES PATENTS

| 3,426,253 | 2/1969 | Roque et al. | 357/34 X |
| 3,772,577 | 11/1973 | Planey | 357/34 X |
| 3,858,234 | 12/1974 | Olson | 357/34 |

Primary Examiner—L. Dewayne Rutledge
Assistant Examiner—J. M. Davis
Attorney, Agent, or Firm—Woodcock, Washburn, Kurtz & Mackiewicz

[57] ABSTRACT

A monocrystalline silicon wafer is prepared which has formed therein the usual emitter, base and collector regions. A groove is then formed to a predetermined depth in the top surface of the silicon wafer so as to extend along the P-N junction between the base and emitter regions. A silicon oxide layer is formed over the wafer, as by heating the same in an oxidative atmosphere, and the wafer is succeedingly heated in a hydrogenous atmosphere. The silicon oxide layer may be selectively photoetched away where the electrodes are to be formed for the emitter, base and collector of the transistor.

13 Claims, 38 Drawing Figures

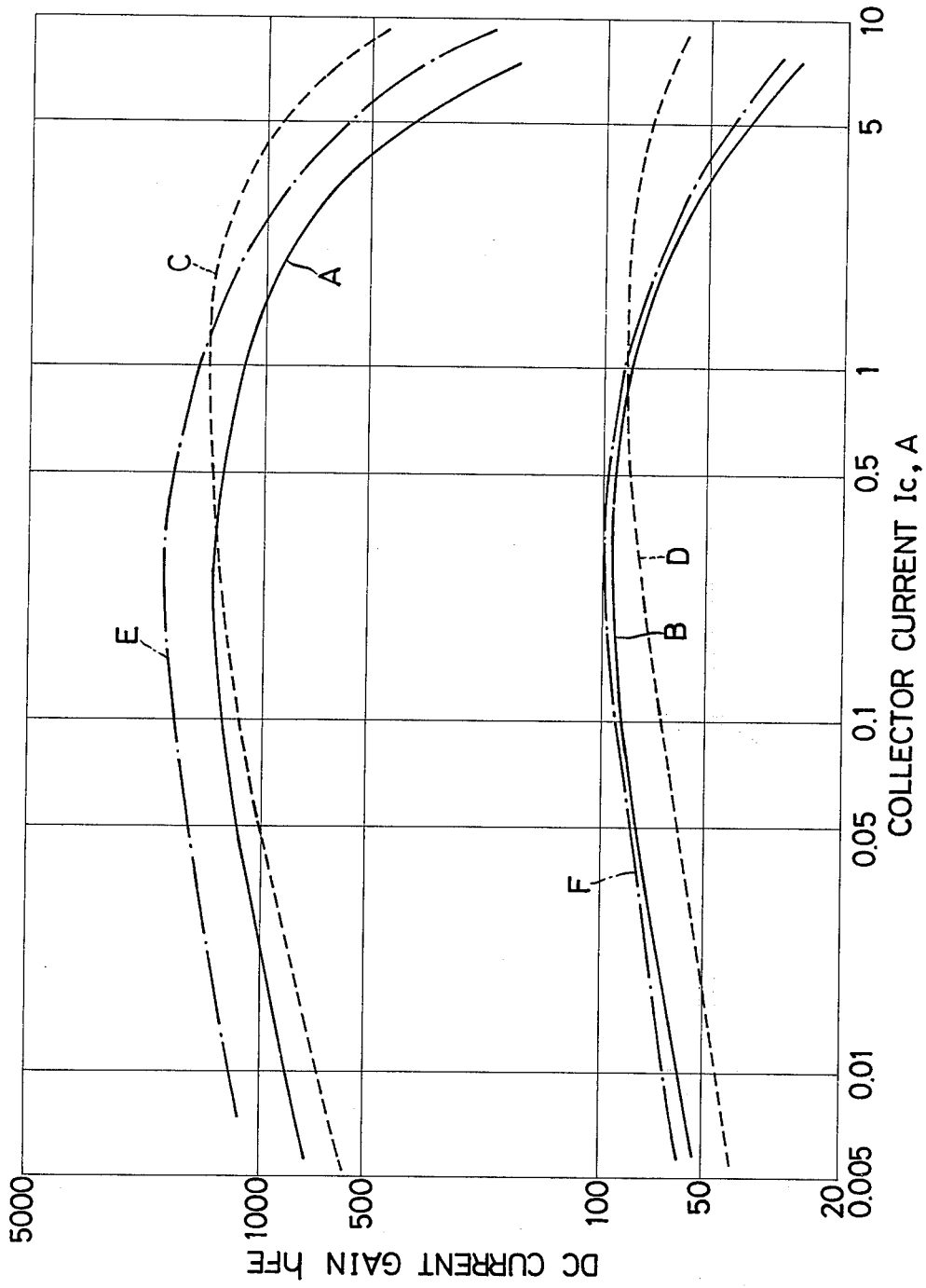

PROCESS FOR THE FABRICATION OF SILICON TRANSISTORS WITH HIGH DC CURRENT GAIN

BACKGROUND OF THE INVENTION

This invention relates generally to transistors, and more specifically to improvements in a process for the fabrication of silicon transistors. Still more specifically, the invention is directed to a fabrication process designed to enhance the DC current gain $h_{FE}$ of the silicon transistors.

As is well known, the silicon transistors in general have a silicon oxide layer formed over the chip surface. The electrical characteristics of the transistors can be stabilized by thus covering their P-N junctions with the silicon oxide layer. However, this arrangement tends to result in the decrease in the transistor parameter $h_{FE}$. This is because there exists in the interface of the silicon and the silicon oxide layer not only silicon dioxide $SiO_2$, which is a stable form of silicon oxide, but also silicon monoxide SiO. Recombination is easy to occur due to the presence of the excess valance electrons of the silicon monoxide.

In order to overcome this defect, it has been proposed to heat the transistor chip in a hydrogenous atmosphere following the formation of the silicon oxide layer thereon. This hydrogen treatment causes the excess valence electrons of the silicon monoxide to combine with hydrogen atoms, as follows:

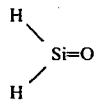

Since then less recombination takes place, the DC current gain of the silicon transistor can be approximately doubled, as later described in more detail with reference to the accompanying drawings. However, no further increase in the current gain is possible solely by the hydrogen treatment.

It is also well known that the reduction in the base width of the silicon transistor results in the increase in its DC current gain. However, the transistor with the reduced base width is susceptible to rupture at the time of secondary breakdown. Its breakdown and punch-through voltages are also lowered. This scheme is therefore not adoptable for the fabrication of transistors that are intended to operate at high voltages.

SUMMARY OF THE INVENTION

It is an object of this invention to provide a simple and thoroughly practicable process for the fabrication of silicon transistors having a high DC current gain.

Another object of the invention is to provide a process for the fabrication of transistors which are not easily ruptured at the time of secondary breakdown in spite of their high $h_{FE}$.

A further object of the invention is to provide a process for the fabrication of transistors the $h_{FE}$ of which is enhanced without a decrease in breakdown and punch-through voltages.

A further object of the invention is to provide a process for the fabrication of transistors having improved linearity of $h_{FE}$ in the operating current range.

A still further object of the invention is to provide a process for the fabrication of transistors in which the temperature dependency of the base-emitter voltage $V_{BE}$ is minimized.

Briefly, this invention provides, in a process for the fabrication of a high DC current gain transistor, the improved steps which include providing a monocrystalline silicon wafer having formed therein an emitter region of one conductivity type, a base region of the opposite conductivity type from the emitter region, and a collector region of the said one conductivity type. At least the emitter and base regions extend to the top surface of the wafer, and the emitter region is confined within the base region so that a P-N junction is formed therebetween. The improved steps according to the invention further comprises forming in the top surface of the wafer a groove which extends along the P-N junction and which has a depth less than the depth of the emitter region, forming a silicon oxide layer at least over the groove, and heating the wafer in a hydrogenous atmosphere.

The base region may be formed by diffusing impurities into the wafer, or it may be formed by the silicon itself of which the wafer is made. In general, the depth of the groove should be from about 1/10 to 4/5 the depth of the emitter region. More specifically, in the case of a diffused-base transistor, the depth of the groove should be from about 1/5 to 4/5, preferably from about ⅓ to ⅔, the depth of the emitter region. In the case of a transistor in which the base region is constituted of the silicon of which the wafer is made, the depth of the groove should be from about 1/10 to ⅔, preferably from about 1/6 to ⁻, the depth of the emitter region.

The silicon oxide layer to be formed at least over the groove should be from about 0.2 to 1.5 microns in thickness. The temperature to which the silicon wafer is heated in the hydrogenous atmosphere should be in the range of from about 300° to 1,000°C, preferably from about 400° to 700°C. The hydrogenous atmosphere should contain at least about 20 percent of hydrogen gas, particularly if the wafer is to be heated to the temperature range of from about 400° to 700°C. The hydrogen gas can be used in combination with inert gas to constitute the hydrogenous atmosphere. While the silicon oxide layer may be formed by heating the wafer in an oxidative atmosphere for practical purposes, it can also be formed by the sputtering method or by the gaseious phase growth method.

While it is rather difficult to explain why the process of this invention leads to the drastic increase in the DC current gain of the silicon transistors, this result seems to arise from the interaction of several reasons. First, by the formation of the groove along the P-N junction between the emitter and base regions, the adjoining portion of the base region is removed which is to provide a base current path in the completed transistor. Since the silicon oxide layer is formed over the groove, the interface of the silicon and the silicon oxide layer as well as its neighboring portion is effectively subjected to the succeeding hydrogen treatment. Secondly, the surface concentration of the impurities is lowered at the grooved area. Thirdly, the injection of carriers from the emitter to the base region takes place in a different mode due to the presence of the groove. It is possible, however, that there exist some different reasons yet unascertained.

The features which are believed to be novel and characteristic of this invention are set forth in particular in the appended claims. The invention itself, however, as well as the additional objects and advantages thereof, will become apparent from the following description which is to be read in connection with the accompanying drawings in which like reference characters refer to like parts throughout the several views.

BRIEF DESCRIPTION OF THE DRAWINGS

FIG. 9 is a graph plotting the curves of $h_{FE}$ against $I_C$ to manifest the advantages of the transistors fabricated in Examples I, II and V of the invention over the prior art;

DETAILED DESCRIPTION OF THE INVENTION

Figure 1:
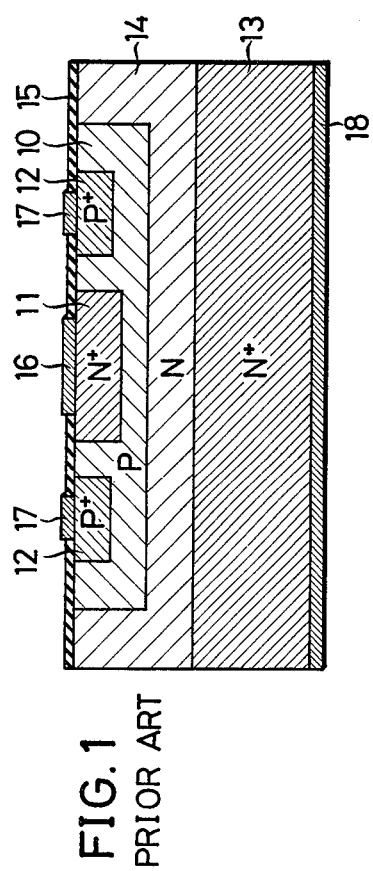
FIG. 1 is a schematic cross sectional view of a silicon transistor fabricated by a prior art process comparable to the process of this invention.

The configuration and fabrication process of a typical example of the prior art diffused-base silicon transistor will now be described in some detail with reference to FIG. 1, the better to make clear the features and advantages of this invention. A P-type base region 10 is formed in an N-type silicon wafer by the diffusion of impurities. Also formed by diffusion in this base region 10 are an N⁺-type emitter region 11 and P⁺-type low-resistance base region 12. An N⁺-type low-resistance collector region 13 is formed by the diffusion of impurities from the bottom surface of the wafer, and an N-type collector region 14 is formed by the N-type silicon portion left between the base region 10 and the N⁺-type low-resistance collector region 13.

A thin layer of silicon dioxide 15 is then formed over the entire top surface of the wafer by heating the same in an oxidative atmosphere. Openings are then formed selectively through the silicon dioxide layer 15 to form nickel electrodes 16 and 17 on the N⁺-type emitter and P⁺-type low-resistance base regions 11 and 12, respectively. A nickel electrode 18 is also formed on the bottom surface of the N⁺-type low-resistance collector region 13.

Figure 2:
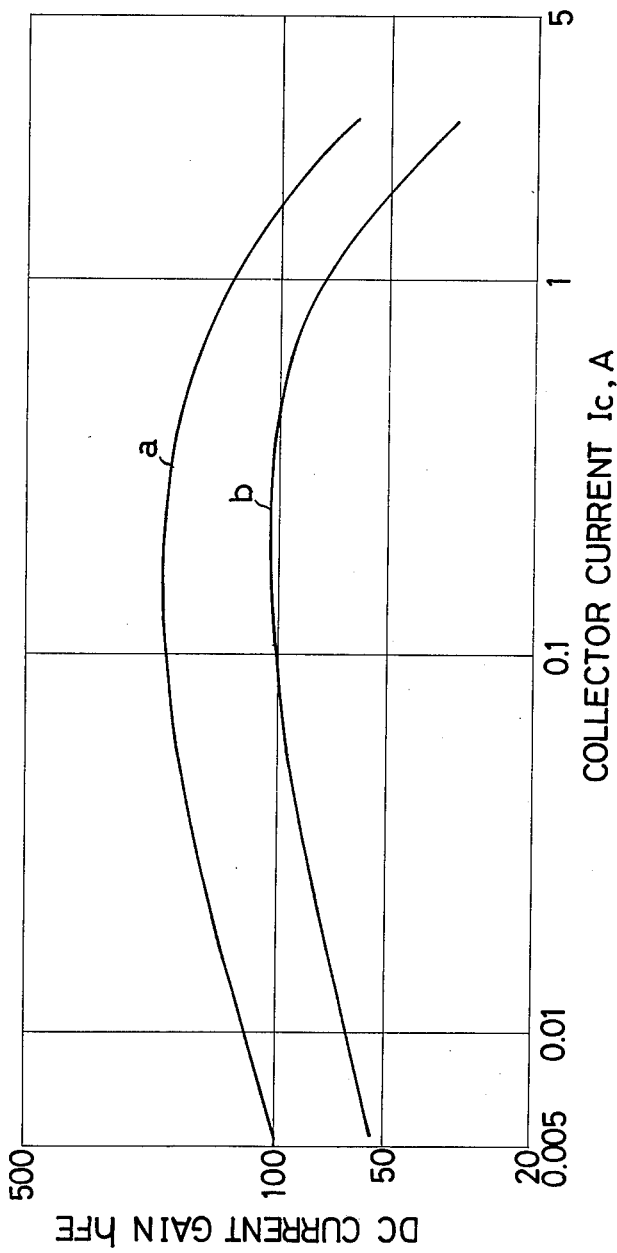
FIG. 2 is a graph plotting the curves of the DC current gain $h_{FE}$ against the collector current $I_C$ by way of explanation of the increase in $h_{FE}$ as a result of the hydrogen treatment performed on the prior art transistor of FIG. 1.

As mentioned previously, the DC current gain $h_{FE}$ of the thus-fabricated transistor varies significantly according to whether the transistor has undergone the hydrogen treatment or not. The indicia $a$ in the graph of FIG. 2 represents the curve of the $h_{FE}$ plotted against the collector current $I_C$ in case the silicon wafer has been heated in a hydrogenous atmosphere following the formation of the silicon dioxide layer thereon. The indicia $b$ represents a similar curve exhibited in case the transistor has been subjected to no such treatment.

For the hydrogen treatment of the silicon wafer, an atmosphere of about 100-percent hydrogen gas may be created by a hydrogen gas stream of 0.5 liter per minute. The silicon wafer may be heated to about 550°C in that atmosphere, perhaps after the nickel electrodes 16, 17 and 18 have been formed thereon.

As will be apparent from FIG. 2, the DC current gain of the transistor approximately doubles by virtue of the hydrogen treatment. However, no further increase in the current gain is possible according to the prior art method. This invention aims at the provision of transistor fabrication techniques which make possible the still further increase in the parameter $h_{FE}$, as will become apparent from the following representation of specific Examples.

EXAMPLE I

Figure 3:
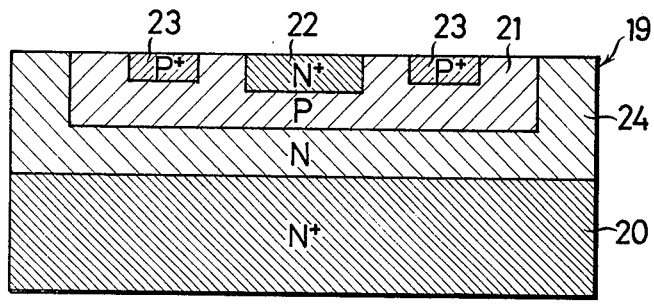
FIGS. 3 to 7, inclusive, are a series of schematic cross sectional views showing the sequential steps for the fabrication of a silicon transistor by the process of this invention, as described in Example I presented succeedingly.

With reference to FIG. 3, there was first prepared a monocrystalline N-type silicon wafer 19 with a resistivity of about 20 ohm-cm. Phosphorus was diffused into the silicon wafer 19 from its bottom surface to a depth of about 90 microns to form an N⁺-type collector region 20 with a surface impurity concentration of about $5 \times 10^{20}$ atoms per cubic centimeter. Boron was diffused into the silicon wafer from its top surface to a depth of about 20.5 microns to form a P-type base region 21 with a surface impurity concentration of about $1 \times 10^{18}$ atoms per cubic centimeter. Phosphorus was again diffused into the wafer from its top surface to a depth of about 15 microns to form within the base region 21 an N⁺-type emitter region 22 with a surface impurity concentration of about $5 \times 10^{20}$ atoms per cubic centimeter. Boron was likewise diffused into the wafer from its top surface to a depth of about 10 microns to form within the base region 21 a P⁺-type low-resistance base region 23 with a surface impurity concentration of about $1 \times 10^{20}$ atoms per cubic centimeter. It will be understood that this P⁺-type low-resistance base region 23 is formed around the emitter region 22 with a suitable spacing therebetween. The conventional techniques were employed for the above impurity diffusion steps.

The reference numeral 24 denotes an N-type collector region formed by the N-type silicon portion left between the N⁺-type collector region 20 and the P-type base region 21. The N-type collector region 24 has a thickness of about 30 microns. The foregoing regions were so formed that, ultimately, the base width of the transistor, that is, the spacing between the emitter region 22 and the N-type collector region 24, would be about 5.5 microns.

Figure 8:
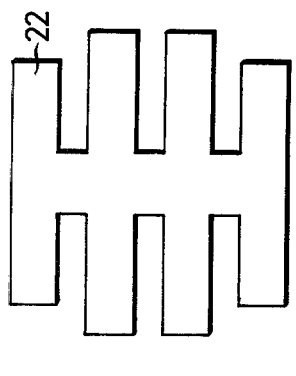
FIG. 8 is a plan view explanatory of the shape of the emitter region of the transistors fabricated in the various Examples of the invention.
Figure 4:
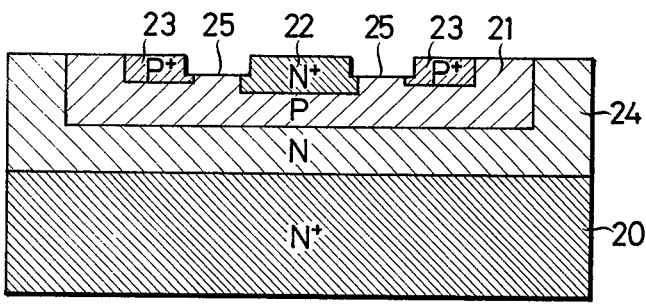

With reference to FIG. 4, a groove 25 was then formed in the top surface of the wafer to a depth of about 6 microns by the usual photoetching method in which there was used an etching solution containing hydrofluoric acid and nitric acid in the ratio of 1 to 10. It will be seen from FIG. 4 that the groove 25 extends all along the P-N junction between the P-type base region 21 and the N⁺-type emitter region 22 and is formed by removing the neighboring portion of the base region 21, which is to provide a path for the base current in the completed transistor, and that of the emitter region 22. When seen in a top plan view, the emitter region 22 has the shape as illustrated in FIG. 8 by way of example. Since this emitter region is completely surrounded by the base region 21 as will be seen from the drawing, it will be apparent that the groove 25 extends all along the boundary between the base and emitter regions. Furthermore, since the P⁺type low-resistance base region 23 is formed in the P-type base region 21 in this specific Example of the invention, the groove 25 is so formed as to partly intrude into the low-resistance base region 23.

Figure 5:
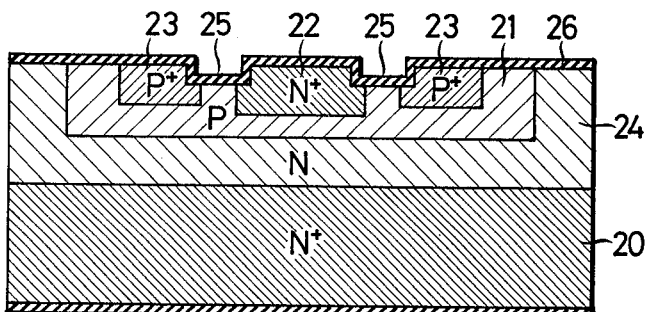

The wafer of FIG. 4 was succeedingly heated to about 1,050°C for 120 minutes in an oxidative atmosphere containing steam and oxygen gas. As a consequence, there was formed over the entire wafer a silicon oxide layer 26 with a thickness of about 0.8 micron, as illustrated in FIG. 5. The diffusion of the impurities in the various regions proceed during this treatment, but only to a negligible degree.

Figure 6:
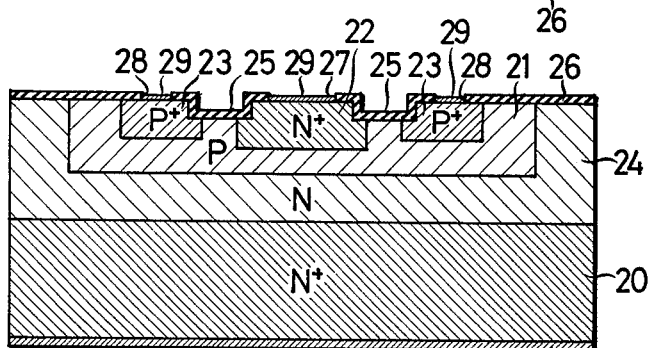

The silicon oxide layer 26 was then selectively removed by the usual photoetching method in which there was used an etching solution containing ammonium fluoride. As illustrated in FIG. 6, openings were thus formed as at 27 and 28 where the electrodes are to be formed for the emitter, base and collector of the transistor. Nickel layers 29 were succeedingly formed over the thus-exposed surfaces of the N⁺-type collector region 20, N⁺-type emitter region 22, and P⁺-type low-resistance base region 23, by the non-electrolytic nickel plating method in which nickel chloride is reduced with sodium hypophosphite for nickel deposition. No nickel deposition takes place over the remaining silicon oxide layer 26.

In order to alter the interface characteristics of the silicon and the silicon oxide layer, the wafer of FIG. 6 was heated to 550°C for 60 minutes in an atmosphere of 100-percent hydrogen gas created by a hydrogen gas stream of 0.5 liter per minute. This heat treatment is also effective for the alloying of the nickel layers 29 and the silicon, resulting in the simplification of the transistor fabrication process.

Figure 7:
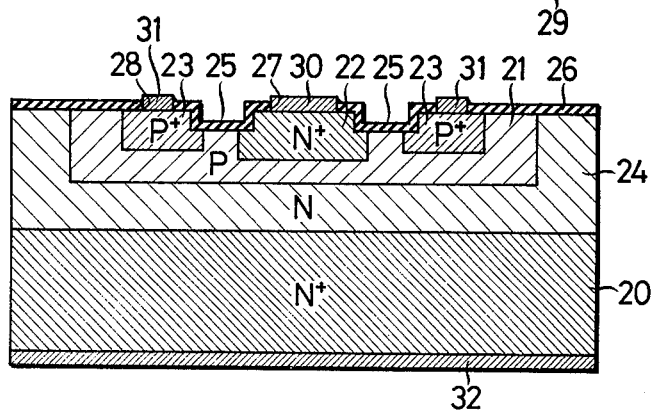

The aforesaid non-electrolytic nickel plating method was used again to form nickel layers with a thickness of about 3 microns, the nickel layers being intended to serve as the emitter electrode 30, base electrode 31 and collector electrode 32, as illustrated in FIG. 7. The wafer was then cut to a square of 4.4 by 4.4 millimeters. The transistor chip thus obtained was enclosed in a metal case of the type TO-66 of Joint Electron Device Engineering Council (JEDEC) specification, of the United States, to complete the transistor according to the invention.

The curve A in the graph of FIG. 9 represents the $I_C$-$h_{FE}$ characteristic of the above fabricated transistor. By the term "$I_C$-$h_{FE}$ characteristic" is meant the change in the DC current gain $h_{FE}$ with the various values of the collector current $I_C$. The graphed results were measured at an ambient temperature of 25°C and the collector-emitter voltage $V_{CE}$ of 4 volts. The curve B represents by way of comparison the $I_C$-$h_{FE}$ characteristic, measured under the above specified conditions, of a transistor which was fabricated by the same process as this Example of the invention except that the wafer was heated in a nitrogenous atmosphere instead of the hydrogenous atmosphere.

It will be observed from the graph that the $_{FE}$ of the transistor which was subjected to the hydrogen treatment according to the invention has a peak value of about 1,500, compared with the peak value of only about 100 exhibited by the transistor which did not undergo the hydrogen treatment. The $h_{FE}$ of the transistor according to the invention is therefore almost 15 times as much as that of the transistor represented by the curve B. Also, in comparison with the $h_{FE}$ of the prior art transistor represented by the curve $a$ in the graph of FIG. 2, which transistor is fabricated with the hydrogen treatment but without the formation of the groove 25, the current gain of the transistor according to the invention is about 8 times as high.

In order to ascertain the extent to which the transistor according to the invention withstands rupture at the time of secondary breakdown (hereinafter referred to as the "rupture withstanding ability"), a voltage of 60 volts was impressed across the collector and emitter of the transistor from a constant voltage source, and a base current was delivered to its base from a constant current source in order that a collector current of 2 amperes might result. A overloading electric power of 120 watts, 20 percent more than its wattage rating of 100 watts, was then supplied to measure the length of time from the initiation of the supply of power to the rupture of the transistor. The transistor according to the invention ruptured in about 10 to 15 seconds. By way of comparison, the rupture withstanding ability of the prior art transistor of FIG. 1 was tested under the same conditions as above. The prior art transistor ruptured in about 2 seconds.

It will be apparent from these results that, in spite of its extremely high current gain, the transistor fabricated by the process of this invention is not easily ruptured at the time of secondary breakdown. Furthermore, since the base width of the transistor is not especially made narrow to realize the high current gain, its breakdown and punch-through voltages are also relatively high.

In the transistor fabricated in this Example of the invention, the P-N junction between the collector and base regions is also covered by the silicon oxide layer 26, and that portion of the silicon oxide layer covering this P-N junction is also subjected to the hydrogen treatment. As a consequence, the collector cutoff current with base grounded, $I_{CBO}$, of the transistor is extremely low compared with the transistor shown in FIG. 1, and its collector cutoff current with emitter grounded, $I_{CEO}$, does not become high in spite of its high current gain.

EXAMPLE II

Figure 10:
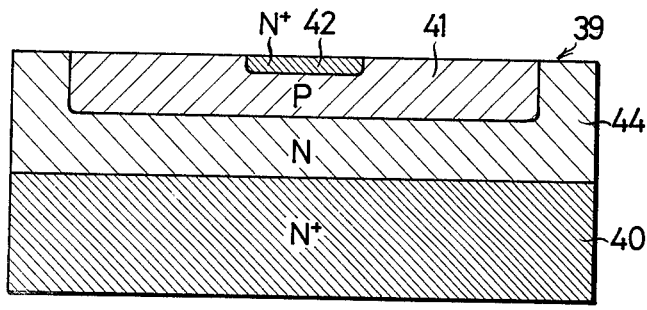
FIGS. 10 to 16, inclusive, are a series of schematic cross sectional views showing the sequential steps for the fabrication of a silicon transistor according to Example II of the invention.

With reference to FIG. 10, a monocrystalline N-type silicon wafer 39 was prepared which had a resistivity of about 20 ohm-cm. Phosphorus was diffused into this silicon wafer 39 from its bottom surface to a depth of about 95 microns to form an N$^+$-type collector region 40 with a surface impurity concentration of about $5 \times 10^{20}$ atoms per cubic centimeter. Boron was diffused into the wafer from its top surface to a depth of about 20 microns to form a P-type base region 41 with a surface impurity concentration of about $1 \times 10^{18}$ atoms per cubic centimeter. Phosphorous was diffused from the top surface of the wafer to a depth of about 3 microns to form within the base region 41 a shallow N$^+$-type emitter region 42 with a surface impurity concentration of about $2 \times 10^{21}$ atoms per cubic centimeter. An N-type collector region 44 was formed by the N-type silicon portion left between the N$^+$-type collector region 40 and the P-type base region 41. The conventional diffusion techniques were employed for the foregoing steps, and the silicon dioxide layer formed over the wafer by these diffusion steps was etched away by use of a hydrogen fluoride etching solution.

Figure 11:
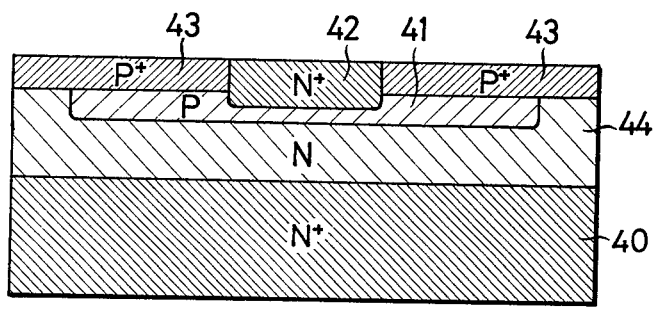

The wafer of FIG. 10 was then subjected to a boton diffusion treatment in which the wafer was heated to 1,200° C for 120 minutes in a nitrogenous atmosphere, with boron trioxide of solid form used as the diffusion source. A P$^+$-type low-resistance base region 43, FIG. 11, with a surface impurity concentration of about $1 \times 10^{20}$ atoms per cubic centimeter was thus formed to a depth of about 12 microns from the top surface of the wafer. This region 43 directly surrounds the N$^+$-type emitter region 42. Although the boron is inevitably diffused to the N$^+$-type emitter region 42 and the N$^+$-type collector region 40 as well, no layer of opposite conductivity type is to be formed in the regions 40 and 42 because the surface concentrations of phosphorous in these regions are higher than the surface impurity concentration in the P$^+$-type low-resistance base region 43. This treatment resulted also in the increase in the depth of the N$^+$-type emitter region 42, to about 15 microns. The base width is now about 5.5 microns.

Figure 12:
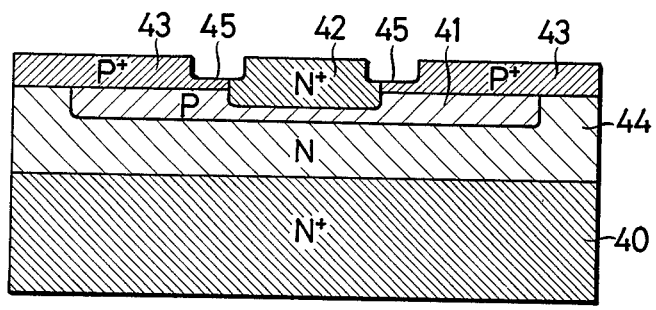

As illustrated in FIG. 12, a groove 45 was formed in the top surface of the wafer to a depth of about 6 microns by the usual photoetching method in which there was employed an etching solution containing hydrofluoric acid and nitric acid in the ratio of 1 to 10. It will be observed from FIG. 12 that the groove 45 extends all along the P-N junction between the P$^+$-type low-resistance base region 43 and the N$^+$-type emitter region 42 and is formed by removing the neighboring portions of these regions. The depth of this groove 45 is less than that of the P$^+$-type low-resistance base region 43; in other words, the groove does not penetrate down to the P-type base region 41.

The so-called mesa etching was then performed on the wafer of FIG. 12 by the conventional photoetching method employing an etching solution containing hydrofluoric acid, nitric acid and acetic acid in the ratio of 1:3:1. The wafer was thus etched down at 45a, FIG. 13, to a depth of about 30 microns.

Figure 13:
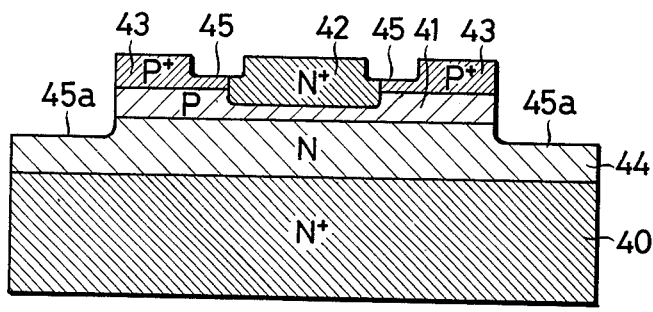
Figure 14:
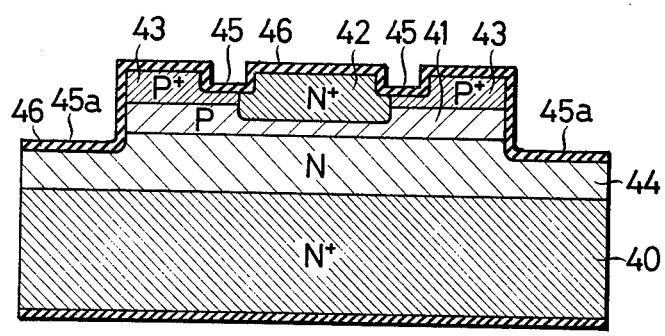

The wafer of FIG. 13 was succeedingly heated to 1,050° C for 120 minutes in an oxidative atmosphere containing steam and oxygen gas. Consequently, there was formed over the entire wafer a silicon oxide layer 46 with a thickness of about 0.8 micron, as illustrated in FIG. 14.

Figure 15:
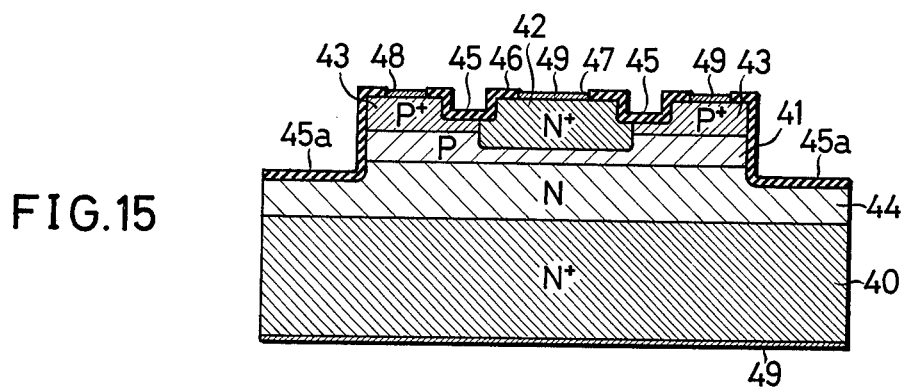

The silicon oxide layer 46 was then selectively removed by the usual photoetching method in which there was used an ammonium fluoride etching solution. As illustrated in FIG. 15, openings were thus formed as at 47 and 48 where the electrodes are to be formed for the emitter, base and collector of the transistor. Thereafter, nickel layers 49 were formed over the thus-exposed surfaces of the N$^+$-type collector region 40, N$^+$-type emitter region 42, and P$^+$-type low-resistance base region 43, by the non-electrolytic nickel plating method in which nickel chloride is reduced with sodium hypophosphite for nickel deposition. No nickel deposition takes place over the remaining silicon oxide layer 46.

In order to alter the interface characteristics of the silicon and the silicon oxide layer, the wafer of FIG. 15 was heated to 550° C for 60 minutes in an atmosphere of 100-percent hydrogen gas created by a hydrogen gas stream of 0.5 liter per minute. Since this treatment is also effective for the alloying of the nickel layers 49 and the silicon wafer, the transistor fabrication process is materially simplified.

Figure 16:
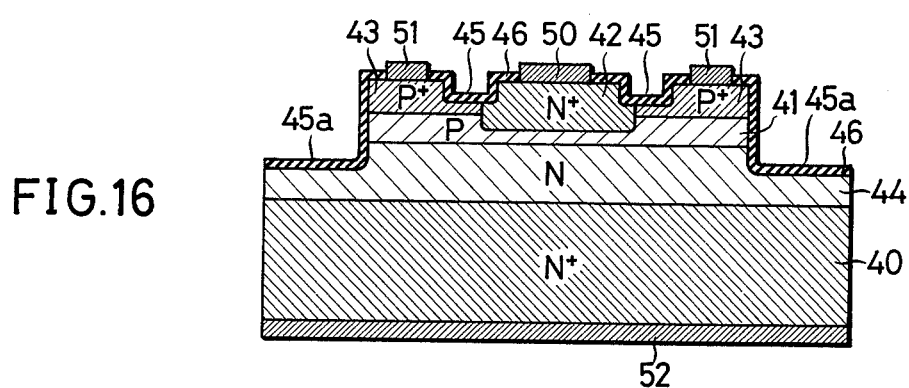

The above non-electrolytic nickel plating method was used again to form the nickel layers 50, 51 and 52, each with a thickness of about 3 microns, that are intended to serve as the emitter electrode, base electrode and collector electrode, respectively, as illustrated in FIG. 16. The wafer was then cut to a square of about 4.4 by 4.4 millimeters. The transistor chip thus obtained was built into a metal case of the type TO-66 of JEDEC specification to complete the transistor according to the invention.

The curve C in the graph of FIG. 9 represents the aforesaid $I_C$-$h_{FE}$ characteristic of the transistor fabricated in this Example II of the invention. The measurement was made at an ambient temperature of 25° C and the collector-emitter voltage $V_{CE}$ of 4 volts. The curve C represents by way of comparison the $I_C$-$H_{FE}$ characteristic, measured under the same conditions as above, of a transistor which was fabricated by the same process as this second Example of the invention except that the wafer was heated in a nitrogenous atmosphere instead of the hydrogenous atmosphere.

As will be apparent from the graph, the DE current gain $h_{FE}$ of the transistor according to the invention has a peak value of about 1,500, compared with the peak value of about 100 exhibited by the transistor of the curve D. The $h_{FE}$ of the transistor according to the invention is about 15 times as high as that of the transistor of the curve D.

It is worth mentioning in connection with the graph of FIG. 9 that the $h_{FE}$ of the transistor according to the invention reaches the peak value when the collector current is about 1 ampere, that is, when the collector current has a relatively high value. Considerably less decrease in the $h_{FE}$ occurs at higher current values. This means that the transistor according to the invention has improved linearity of the $h_{FE}$ in the current range of from about 0.05 to 5 amperes in which the transistor is intended to operate in practice. This improved linearity may be accounted for by the fact that part of the P$^+$-type low-resistance base region 43 is left under the groove 45, as above stated in connection with FIG. 12.

Figure 17:
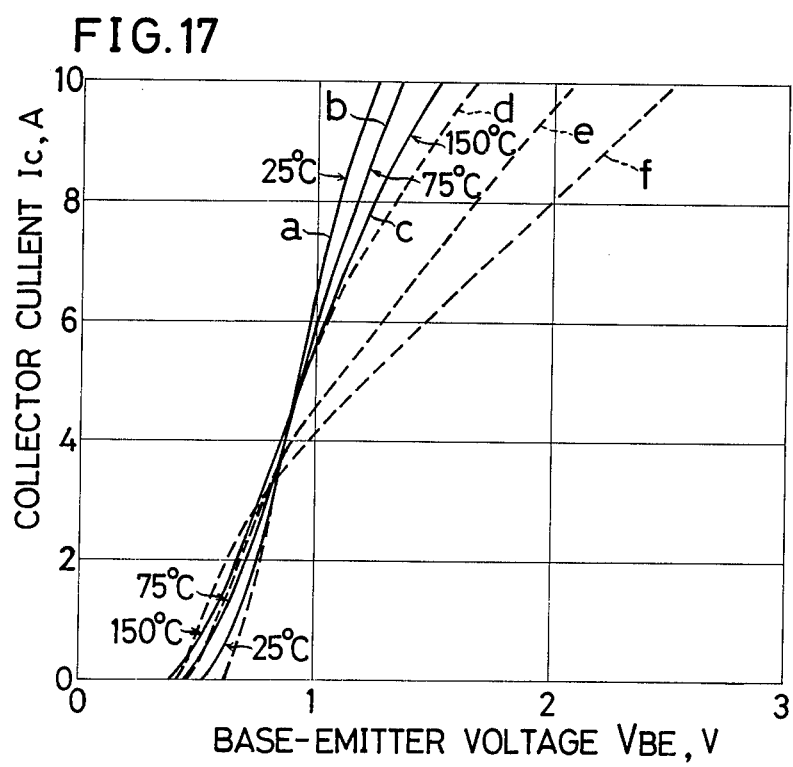
FIG. 17 is a graph plotting the curves of $I_C$ against the base emitter voltage $V_{BE}$ at various ambient temperatures to manifest the improved temperature dependency of the $V_{BE}$ of the transistor fabricated in Example II of the invention as compared with the prior art.

The indicia a, b and c in the graph of FIG. 17 refer to the curves of the collector current $I_C$ plotted against the base-emitter voltage $V_{BE}$, of the transistor of this second Example when its ambient temperature is 25° C, 75° C and 150° C, respectively. The graph is intended to manifest the temperature dependency of the base-emitter voltage. The curves $d$, $e$ and $f$ represent the characteristics exhibited by the prior art transistor of FIG. 1 when its ambient temperature is 25° C (curve $d$), 75° C (curve $e$) and 150° C (curve $f$).

It will be noted from the graph that the temperature dependency of the $V_{BE}$ of the transistor according to the invention is significantly improved. In the characteristic curve $f$ the $V_{BE}$ is about 2.5 volts when the $I_C$ is 10 amperes. Contrastively, in the characteristic curve $c$, the $V_{BE}$ is only about 1.5 volts when the $I_C$ is 10 amperes.

Measurement was also made as the rupture withstanding ability of the transistor of this second Example and as to its collector cutoff current with base grounded. The results were approximately the same as those set forth in Example I.

EXAMPLE III

Figure 18:
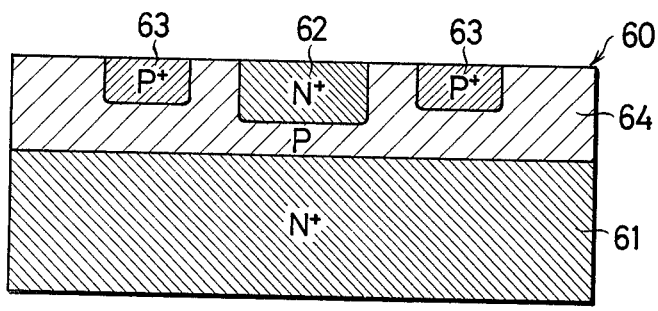
FIGS. 18 to 23, inclusive, are a series of schematic cross sectional views showing the sequential steps for the fabrication of a silicon transistor according to Example III of the invention.

A monocrystalline P-type silicon wafer 60 shown in FIG. 18 was prepared which has a resistivity of about 20 ohm-cm. Phosphorous was diffused into this silicon wafer from its bottom surface to a depth of about 95 microns to form an N$^+$-type collector region 61 with a surface impurity concentration of about $5 \times 10^{20}$ atoms per cubic centimeter. Phosphorus was again diffused into the silicon wafer from its top surface to a depth of about 35 microns to form an N$^+$-type emitter region 62 with a surface impurity concentration of about $5 \times 10^{21}$ atoms per cubic centimeter. Boron was also diffused from the top surface of the wafer to a depth of about 25 microns to form a P$^+$-type low-resistance base region 63 with a surface impurity concentration of about $1 \times 10^{20}$ atoms per cubic centimeter. As in Example I of the invention, the P$^+$-type low-resistance base region 63 is formed around the N$^+$-type emitter region 62 with a suitable spacing therebetween. The conventional techniques were employed for the above impurity diffusion steps. A P-type base region 64 was formed by the P-type silicon portion of the wafer left after the foregoing diffusing operations and thus has a substantially constant distribution of impurity concentration throughout the region. The base width is about 15 microns.

Figure 19:
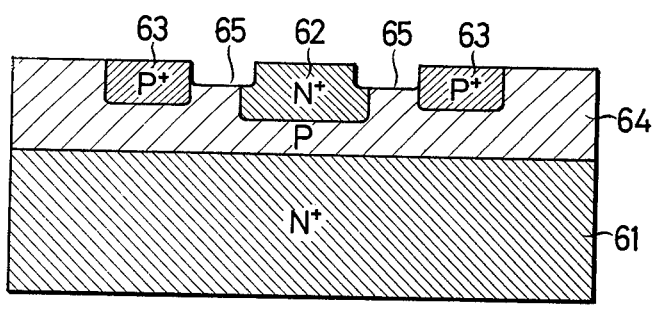

As illustrated in FIG. 19, a groove 65 was then formed in the top surface of the wafer to a depth of about 8 microns by the usual photoetching method in which there was employed an etching solution containing a mixture of hydrofluoric acid and nitric acid in the ratio of 1 to 10. The groove 65 extends all along the P-N junction between the N$^+$-type emitter region 62 and the P-type base region 64 and is formed by removing the neighboring portions of these regions.

The wafer of FIG. 19 was subjected to the mesa etching operation in which there was used an etching solution containing hydrofluoric acid, nitric acid and acetic acid in the ratio of 1:3:1. The wafer thus etched down to a depth of about 60 microns, as indicated at 65$a$ in FIG. 20.

Figure 20:
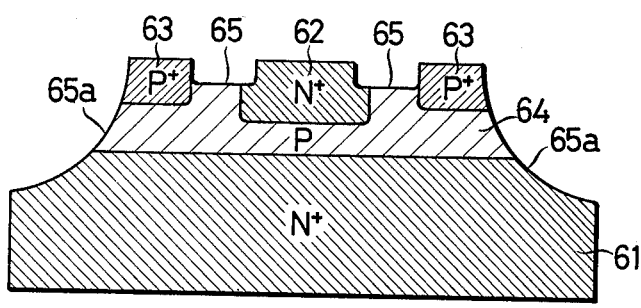
Figure 21:
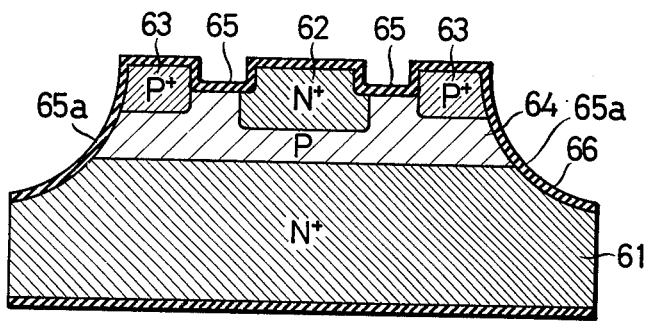

The wafer of FIG. 20 was succeedingly heated to 1,050° C for 120 minutes in an oxidative atmosphere containing steam and oxygen gas. As illustrated in FIG. 21, a silicon oxide layer 66 with a thickness of about 0.8 micron was thus formed over the entire wafer.

The silicon oxide layer 66 was selectively removed by the known photoetching method in which there was used an etching solution containing ammonium fluoride. Openings such as those indicated at 67 and 68 in FIG. 22 were thus formed where the electrodes are to be formed for the emitter, base and collector of the transistor. The thus-exposed surfaces of the N$^+$-type collector region 61, N$^+$-type emitter region 62 and P$^+$-type low-resistance base region 63 were then coated with nickel layers 69 by the non-electrolytic nickel plating method in which nickel chloride is reduced with sodium hypophosphite for nickel deposition.

Figure 22:
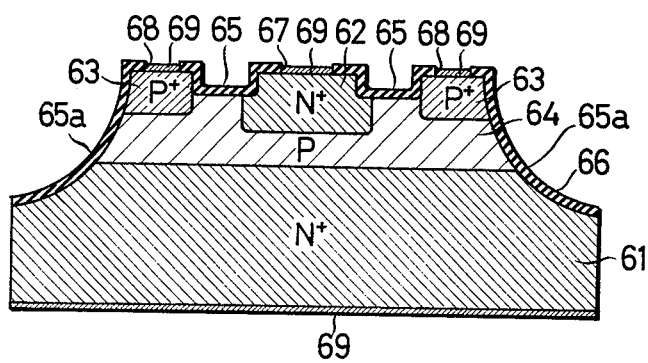
Figure 23:
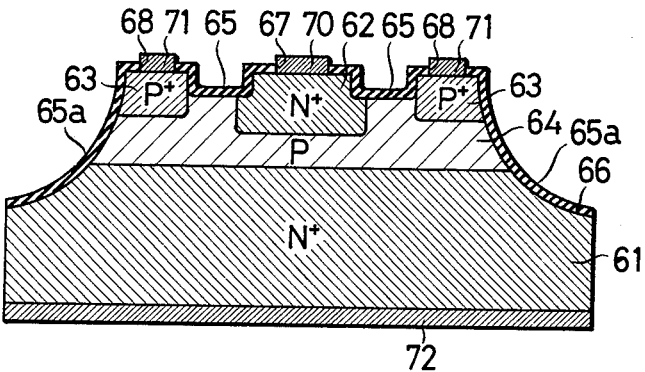

The wafer of FIG. 22 was succeedingly heated to 550°C for 60 minutes in an atmosphere of 100-percent hydrogen gas formed by a hydrogen gas stream of 0.5 liter per minute. Thereafter, the above non-electrolytic nickel plating method was used again to form the nickel layers, each with a thickness of about 3 microns, that are intended to serve as the emitter electrode 70, base electrode 71 and collector 72, as indicated in FIG. 23. The wafer was then cut to a square of about 4.4 by 4.4 millimeters. This transistor chip was enclosed in a metal case of the type TO-66 of JEDEC specification to complete the transistor according to the invention.

Figure 24:
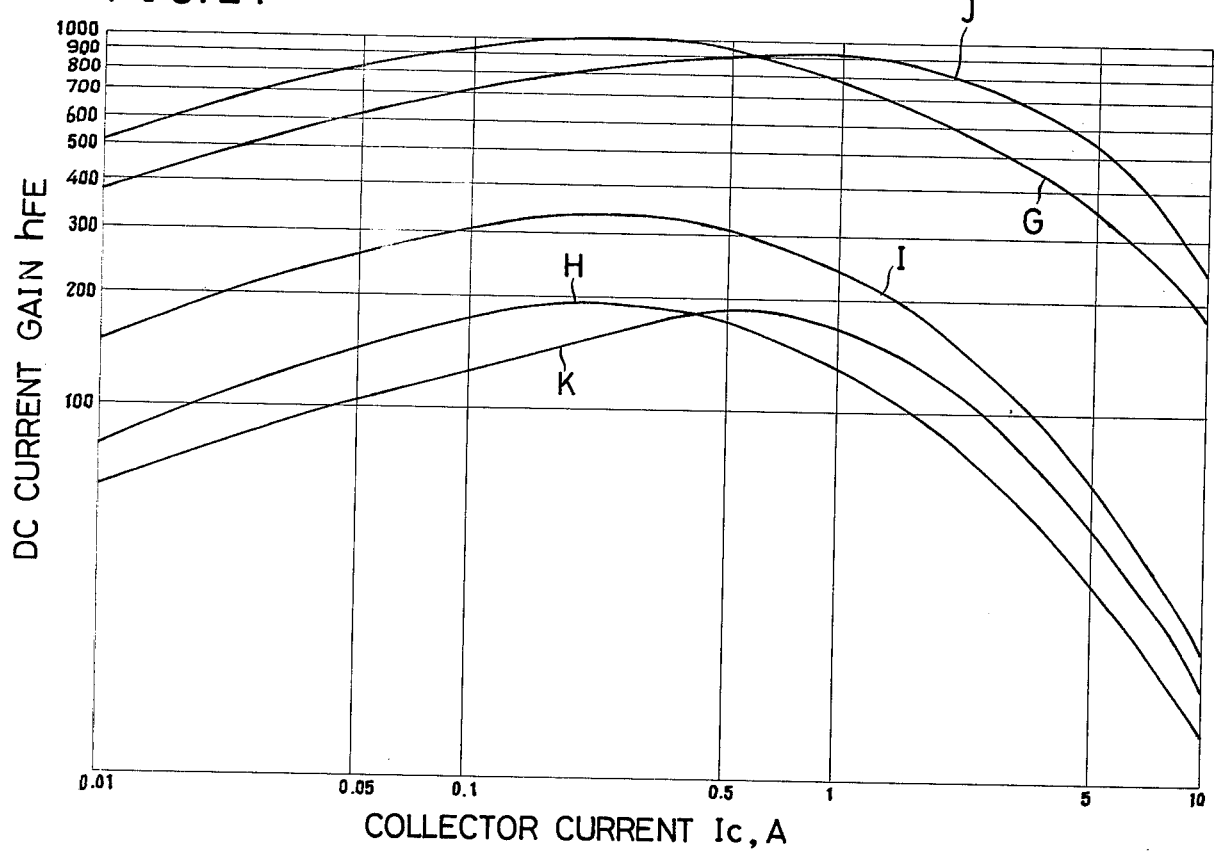
FIG. 24 is a graph plotting the curves of $h_{FE}$ against $I_C$ to manifest the advantages of the transistors fabricated in Examples III and IV of the invention over the prior art.

The curve G in the graph of FIG. 24 represents the aforesaid $I_C$-$h_{FE}$ characteristic of the transistor fabricated in this Example III of the invention. The measurement was made at an ambient temperature of 25° C and the collector-emitter voltage $V_{CE}$ of 4 volts. The curve H represents by way of comparison the $I_C$-$h_{FE}$ characteristic, measured under the same conditions as above, of a transistor which was fabricated by the same process as this Example of the invention except that the wafer was heated in a nitrogenous atmosphere instead of the hydrogenous atmosphere. The curve I represents, also by way of comparison, the $I_C$-$h_{FE}$ characteristic, measured under the same conditions as above, of another transistor which was fabricated with the hydrogen treatment but without the formation of the groove 65. It will be seen from this graph that the $h_{FE}$ of the transistor according to the invention has a peak value of as high as about 1,000, compared with the peak value of about 200 exhibited by the transistor of the curve H and with that of about 300 exhibited by the transistor of the curve I.

Measurement was also made as to the rupture withstanding ability and the $I_{CBO}$ of the transistor of this Example III. The results were approximately the same as those set forth in Example I.

EXAMPLE IV

Figure 25:
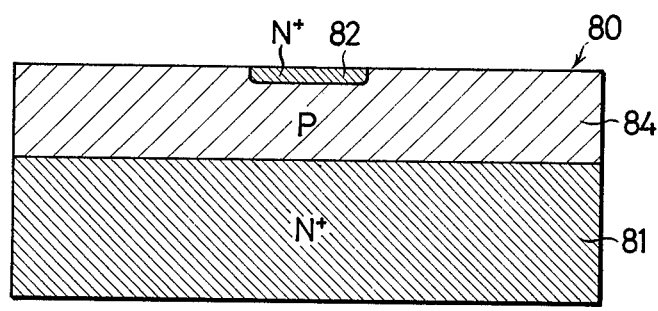
FIGS. 25 to 31, inclusive, are a series of schematic cross sectional views showing the sequential steps for the fabrication of a silicon transistor according to Example IV of the invention.

As illustrated in FIG. 25, a monocrystalline P-type silicon wafer 80 was prepared which had a resistivity of about 20 ohm-cm. Phosphorous was diffused into this silicon wafer 80 from its bottom surface to a depth of about 95 microns to form an N$^+$-type collector region 81 with a surface impurity concentration of about $5 \times 10^{20}$ atoms per cubic centimeter. Phosphorous was again diffused into the wafer from its top surface to a depth of about 3 microns to form a shallow N$^+$-type emitter region 82 with a surface impurity concentration of about $2 \times 10^{21}$ atoms per cubic centimeter. A P-type base region 84 with a thickness of about 50 microns was formed by the remaining P-type silicon portion of the wafer. The conventional techniques were used for the above diffusion steps, and the silicon dioxide layer formed over the wafer by these steps was etched away by use of a hydrogen fluoride etching solution.

Figure 26:
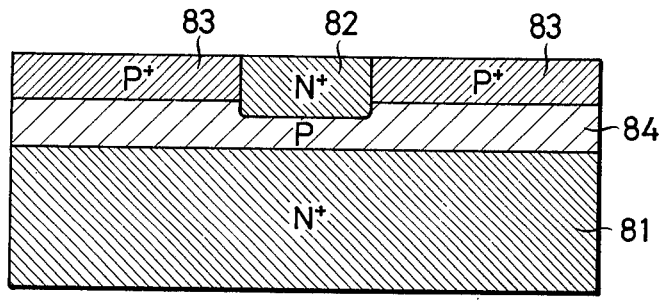

The wafer of FIG. 25 was then subjected to a boron diffusion treatment in which the wafer was heated to 1,275° C for 5 hours in a nitrogen gas atmosphere, with boron trioxide of solid form used as the diffusion source. As illustrated in FIG. 26, a P⁺-type low-resistance base region 83 directly surrounding the N⁺-type emitter region 82 and thoroughly overlying the P-type base region 84 was thus formed to a depth of about 15 microns from the top surface of the wafer. This P⁺-type low-resistance base region 83 had a surface impurity concentration of about $1 \times 10^{20}$ atoms per cubic centimeter. The above treatment resulted also in the increase in the depth of the N⁺-type emitter region 82, to about 35 microns, so that the emitter region penetrated down to the P-type base region 84. The base width became about 15 microns.

Figure 27:
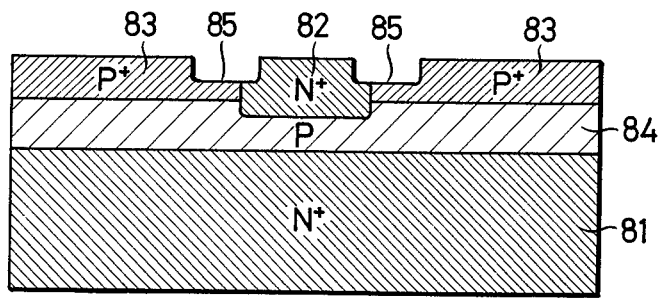

With reference to FIG. 27, a groove 85 was formed in the top surface of the wafer to a depth of about 8 microns by the usual photoetching method in which there was employed an etching solution containing hydrofluoric acid and nitric acid in the ratio of 1 to 10. As will be seen from the drawing, the groove 85 extends all along the P-N junction between the N⁺-type emitter region 82 and the P⁺-type low-resistance base region 83 and is formed by removing the neighboring portions of these regions. The depth of this groove is less than that of the P⁺-type low-resistance base region 83 so that part of this region is left under the groove.

The mesa etching operation was then performed on the wafer of FIG. 27 by the known photoetching method employing an etching solution containing hydrofluoric acid, nitric acid and acetic acid in the ration of 1:3:1. The wafer was thus etched down to a depth of about 60 microns, as indicated at 85a in FIG. 28.

Figure 28:
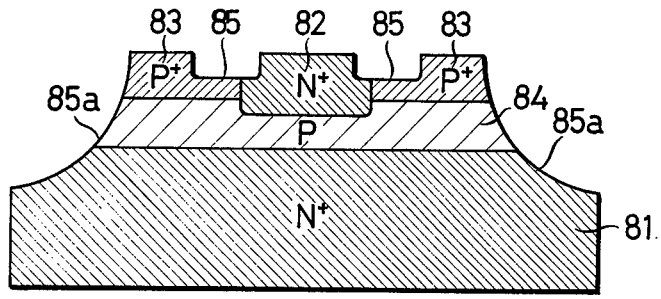
Figure 29:
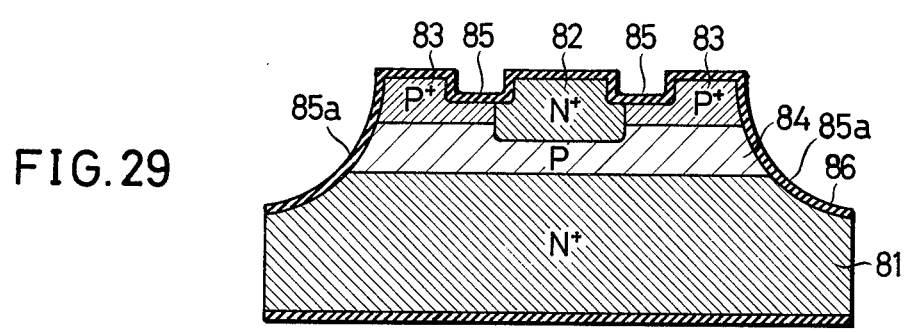

The wafer of FIG. 28 was succeedingly heated to 1,050° C for 120 minutes in an oxidative atmosphere containing steam and oxygen gas. As a result, there was formed over the entire wafer a silicon oxide layer 86 with a thickness of about 0.8 micron, as illustrated in FIG. 29.

Figure 30:
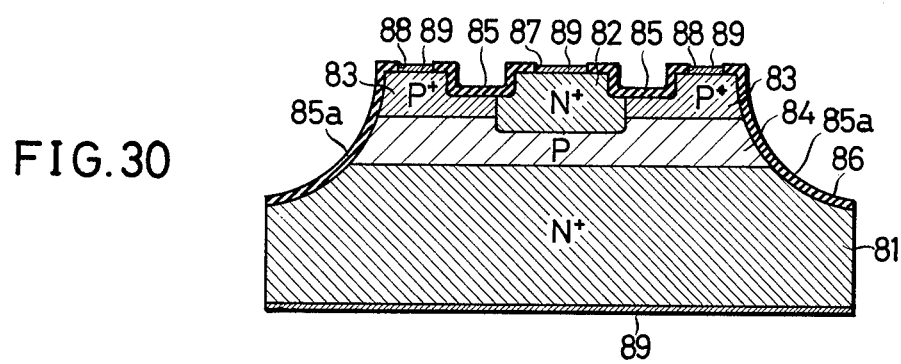

By the usual photoetching method in which there was used an ammonium fluoride etching solution, the silicon oxide layer 86 was selectively removed as at 87 and 88, FIG. 30, where the electrodes are to be formed for the emitter, base and collector of the transistor. Nickel layers 89 were then formed over the thus-exposed surfaces of the N⁺-type collector region 81, N⁺-type emitter region 82 and P⁺-type low resistance base region 83, by the non-electrolytic nickel plating method in which nickel deposition. No nickel deposition takes place over the remaining silicon oxide layer 86.

The wafer of FIG. 30 was heated to 550° C for 60 minutes in an atmosphere of 100-percent hydrogen gas created by a hydrogen gas stream of 0.5 liter per minute. This treatment is also effective for the alloying the nickel layers 89 and the silicon wafer.

Figure 31:
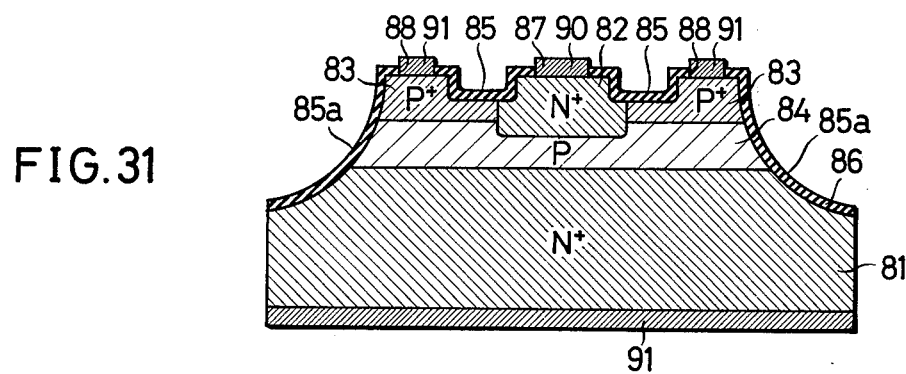

The above non-electrolytic nickel plating method was used again to form the emitter electrode 90, base electrode 91 and collector electrode 92 which are in the form of nickel layers with a thickness of about 3 microns, as illustrated in FIG. 31. The wafer was then cut to a square of about 4.4 by 4.4 millimeters. This transistor chip was likewise enclosed in a metal case of the type TO-66 of JEDEC specification to complete the transistor according to the invention.

The curve J in the graph of FIG. 24 represents the $I_C$-$h_{FE}$ characteristic of the above fabricated transistor according to the invention. The measurement was made at an ambient temperature of 25° C and the collector-emitter voltage $V_{CE}$ of 4 volts. The curve K in the same graph represents by way of comparison the $I_C$-$h_{FE}$ characteristic, measured under the same conditions as above, of a transistor which was fabricated by the same process as this Example IV of the invention except that the wafer was heated in a nitrogenous atmosphere instead of the hydrogenous atmosphere.

The peak value of the $h_{FE}$ of the transistor according to the invention is as high as about 1,000, while the $h_{FE}$ peak value of the transistor of the curve K is only about 200. Further, as in Example II of the invention, the $h_{FE}$ of the transistor according to the invention reaches a peak value when the collector current $I_C$ is about 1 ampere, and no abrupt decrease in the $h_{FE}$ takes place at higher $I_C$ values. It can therefore be stated that the transistor fabricated in this Example also has improved linearity of current gain in the current range of from about 0.05 to 5 amperes in which the transistor is designed to operate. This improved linearity results from the fact that the depth of the groove 85 is made less than that of the P⁺-type low-resistance base region 83, as previously mentioned in connection with FIG. 27.

Figure 32:
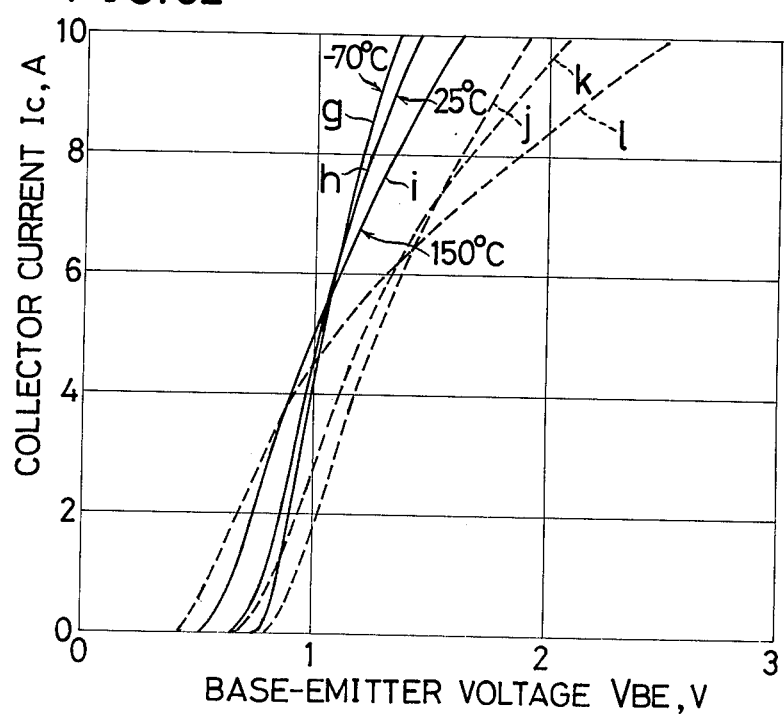
FIG. 32 is a graph plotting the curves of $I_C$ against $V_{BE}$ at various ambient temperatures to manifest the improved temperature dependency of the $V_{BE}$ of the transistor fabricated in Example IV of the invention as compared with the prior art.

The curves g, h and i in the graph of FIG. 32 represent the relations between the base-emitter voltage $V_{BE}$ and the collector current $I_C$ in the transistor of this Example IV when its ambient temperature is −70° C, 25° C and 150° C, respectively. The graph is intended to manifest the temperature dependency of the $V_{BE}$ of the transistor. By way of comparison, the curves j, k and l in the same graph represent similar relations exhibited by a prior art transistor which was fabricated without the formation of the groove 85 in FIG. 31, when its ambient temperature is −70° C (curve j), 25° C (curve k) and 150° C (curve l). It will be seen from this comparison with the prior art that less increase occurs in the $V_{BE}$ of the transistor according to the invention at high $I_C$ values.

Measurement was also made as to the rupture withstanding ability and the $I_{CBO}$ of the transistor of this fourth Example. The results were approximately the same as those set forth in Example I.

EXAMPLE V

Figure 33:
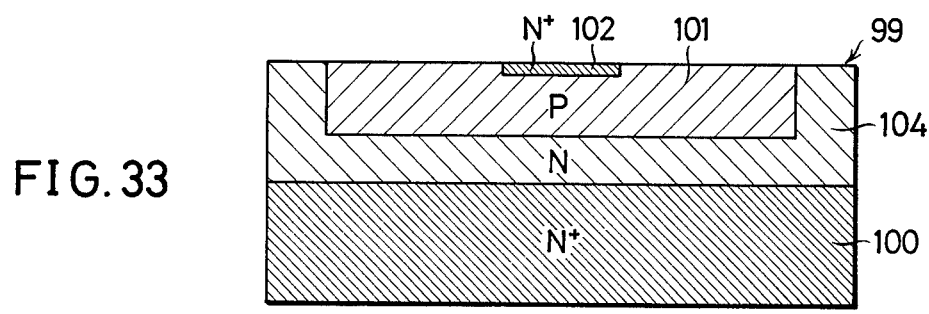
FIGS. 33 to 38, inclusive, are a series of schematic cross sectional views showing the sequential steps for the fabrication of a silicon transistor according to Example V of the invention.

A monocrystalline N-type silicon wafer 99 shown in FIG. 33 was prepared which had a resistivity of about 20 ohm-cm. Phosphorus was diffused into this silicon wafer 99 from its bottom surface to a depth of about 90 microns to form an N⁺-type emitter region 100 with a surface impurity concentration of about $5 \times 10^{20}$ atoms per cubic centimeter. Boron was diffused into the wafer from its top surface to a depth of about 20 microns to form a P-type base region 101 with a surface impurity concentration of about $1 \times 10^{18}$ atoms per cubic centimeter. Phosphorous was diffused into the P-type base region 101 from the top surface of the wafer to a depth of about 3 microns to form a shallow N⁺-type emitter region 102 with a surface impurity concentration of about $2 \times 10^{21}$ atoms per cubic centimeter. An N-type collector region 104 with a thickness of about 30 microns was formed by the remaining N-type silicon portion of the wafer. The well known techniques were used for the foregoing impurity diffusion steps, and the silicon dioxide layer formed over the wafer by these steps was etched away with a hydrogen fluoride etching solution.

Figure 34:
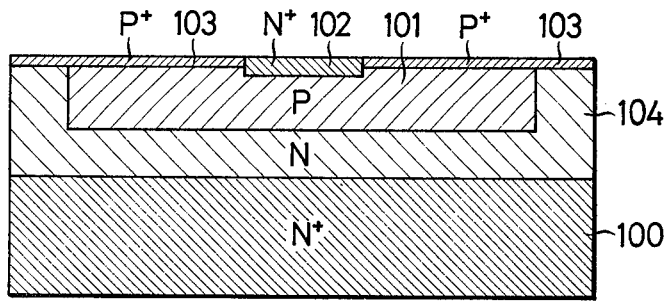

A boron diffusion treatment was then effected on the wafer of FIG. 33 by heating the same to 1,050° C for 60 minutes in a nitrogen gas atmosphere, with boron tribromide of liquid form used as the diffusion source. As illustrated in FIG. 34, a shallow P⁺-type low-resistance base region 103 was thus formed to a depth of about 2 microns from the top surface of the wafer so as to directly surround the $N^+$-type emitter region 102. This region 103 has a surface impurity concentration of about $1 \times 10^{20}$ atoms per cubic centimeter. Although the boron is inevitably diffused to the $N^+$-type collector region 100 and the $N^+$-type emitter region 102 as well, no layer of opposite conductivity type is to be formed in the regions 100 and 102 because the surface concentrations of phosphorus in these regions are made higher than the surface impurity concentration in the $P^+$-type low-resistance base region 103.

Figure 35:
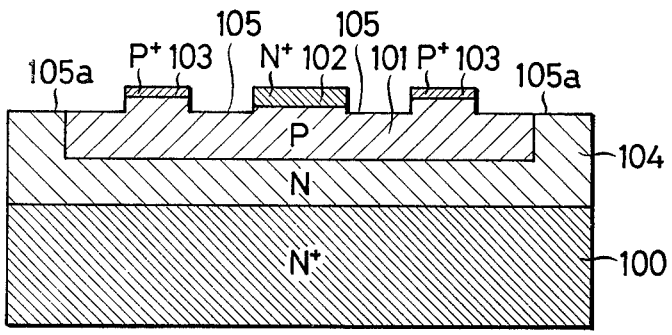

As illustrated in FIG. 35, a groove 105 was formed in the top surface of the wafer to a depth of about 6 microns by the usual photoetching method in which there was used an etching solution containing hydrofluoric acid and nitric acid in the ratio of 1 to 10. The groove 105 is formed all along the P-N junction between the $N^+$-type emitter region 102 and the $P^+$-type low-resistance base region 103 and extends down into the P-type base region 101. The $P^+$-type low-resistance base region 103 is thus completely separated from the $N^+$-type emitter region 102. By the same photoetching operation the wafer was also etched at 105a, to a depth of about 6 microns, mainly to remove that portion of the $P^+$-type low-resistance base region 103 which directly overlies the N-type collector region 104.

Figure 36:
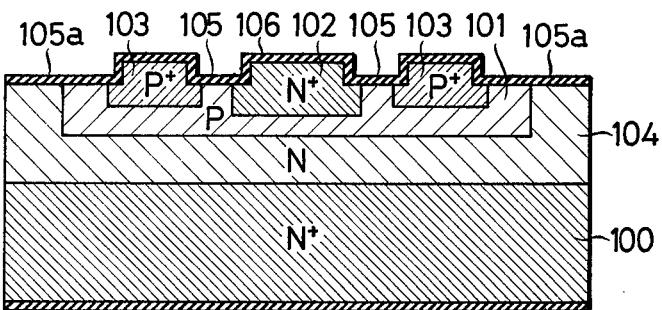

The wafer of FIG. 35 was then heated to 1,050° C for 120 minutes in an oxidative atmosphere containing steam and oxygen gas. There was thus formed over the entire wafer a silicon oxide layer 106 with a thickness of about 0.8 micron, as illustrated in FIG. 36. Succeedingly, the wafer was further heated to 1,200° C for 100 minutes in a nitrogenous atmosphere, with the result that the emitter region 102 and the low-resistance base region 103 increased in depth, to about 15 microns and 10 microns, respectively. The base width, that is, the thickness of the P-type base portions sandwiched between the emitter region 102 and the collector region 104, became about 5.5 microns.

Figure 37:
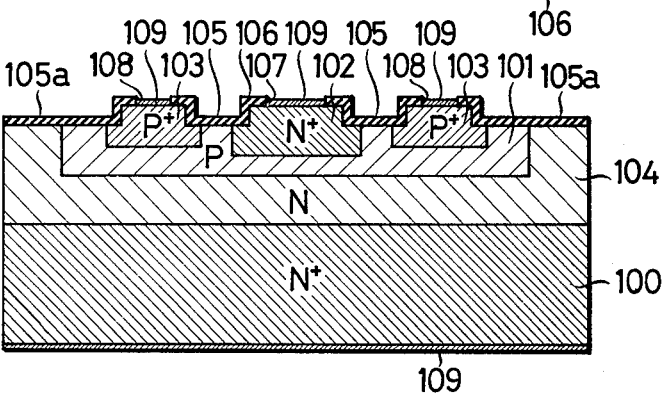

By the usual photoetching method in which there was employed an ammonium fluoride etching solution, the silicon oxide layer 106 was selectively removed as at 107 and 108, FIG. 37, where the electrodes are to be formed for the emitter, base and collector of the transistor. Nickel layers 109 were then formed over the thus-exposed surfaces of the $N^+$-type collector region 100, $N^+$-type emitter region 102 and $P^+$-type low-resistance base region 103, by the non-electrolytic nickel plating method in which nickel chloride is reduced with sodium hypophosphite for nickel deposition.

The wafer of FIG. 37 was then heated to 550° C for 60 minutes in an atmosphere of 100-percent hydrogen gas created by a hydrogen gas stream of 0.5 liter per minute. This treatment is also effective for the alloying of the nickel layers 109 and the silicon wafer.

Figure 38:
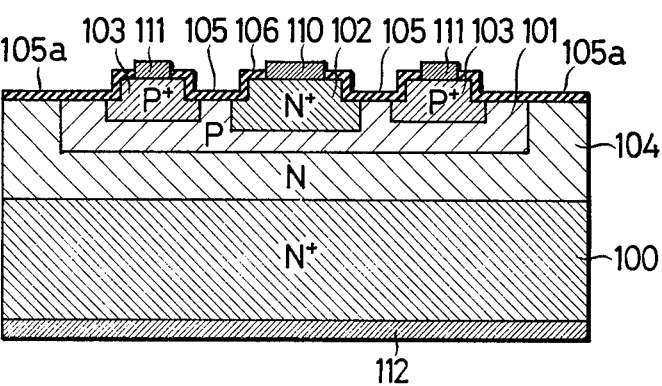

The above non-electrolytic nickel plating method was used again to form the emitter electrode 110, base electrode 111 and collector electrode 112 in the form of nickel layers with a thickness of about 3 microns, as illustrated in FIG. 38. The wafer was then cut to a square of about 4.4 by 4.4 millimeters. This transistor chip was built into a metal case of the type TO-66 of JEDEC specification to complete the transistor according to the invention.

The $I_C$-$h_{FE}$ characteristic of the above fabricated transistor is represented by the curve E in the graph of FIG. 9. The measurement was made at an ambient temperature of 25° C and the collector-emitter voltage $V_{CE}$ of 4 volts. The curve F in the same graph represents by way of comparison the $I_C$-$h_{FE}$ characteristic, measured under the same conditions as above, of a transistor which was fabricated by the same process as this Example V of the invention except that the wafer was heated in a nitrogenous atmosphere instead of the hydrogenous atmosphere. It will be noted that the peak value of the $h_{FE}$ of the transistor according to the invention is as high as about 1,600, compared with the $h_{FE}$ peak value of only about 100 exhibited by the transistor of the curve F.

Measurement was also made as to the rupture withstanding ability and the $I_{CBO}$ of the transistor of this Example V. The results were approximately the same as those set forth in Example I.

It is one of the most pronounced features of this final Example of the invention that the $P^+$-type low-resistance base region 103 can be formed without resort to the selective diffusion technique, as will be understood by referring back to FIG. 34.

Although the transistor fabrication process according to the invention has been shown and described hereinbefore in terms of its specific Examples, it is understood that the invention itself is not to be restricted by the exact showing of the drawings or the description thereof but is inclusive of various modifications on the basis of this disclosure. For example, while the silicon oxide layer is formed over the wafer by heating the same in an oxidative atmosphere in all the Examples of the invention, this layer can of course be formed by the sputtering or the gaseous phase growth method.

Further, while the hydrogen treatment is performed on the wafer after the initial non-electrolytic nickel plating operation in each Example, the hydrogen treatment can be made at any time following the formation of the silicon oxide layer over the wafer, either before or after the formation of the nickel layers. However, the sequence set forth in the various Examples is preferable from the standpoint of simplicity of the fabrication process. If the electrodes are to be made of aluminum, then the wafer should be subjected to the hydrogen treatment before the formation of the aluminum electrodes because, otherwise, the aluminum layers would be melted away from the hydrogen treatment in which the wafer is heated, for example, to 550° C for 60 minutes.

It should also be understood that this hydrogen treatment can be performed under widely varying conditions of hydrogen concentration, temperature and time, those set forth in the preceding Examples being merely by way of example. Such conditions of the hydrogen treatment are, indeed, selectable as desired to controllably vary the DC current gain of the transistor to be fabricated. However, at a temperature of 500° C or thereabouts, the effects of the hydrogen treatment will noticeably deteriorate if less than 20 percent of hydrogen gas is used in combination with nitrogen or other inert gases. It has also been confirmed that the desired effects are derived from the hydrogen treatment to the fullest extent possible in about 30 to 60 minutes if the treatment is made at about 500° C in an atmosphere of 100-percent hydrogen gas.

The $P^+$-type low-resistance base region shown and described in all the Examples of the invention is provided because the Examples are directed to the fabrication of power transistors. This region can of course be omitted in the case where the transistors to be made are designed to handle relatively small current and power. It will also be apparent that the shape of the emitter region is not limited to that specifically illustrated in FIG. 8.

Furthermore, while all the Examples are directed to the fabrication of NPN transistors, the process of this invention is applicable to that of PNP transistors as well. The inventive process is also applicable to the fabrication of transistors by use of epitaxial silicon wafers. Also in Example V of the invention, the depths of the $N^+$-type emitter region 102 and the $P^+$-type low-resistance base region 103 can be caused to increase to the desired extents by an independent heat treatment.

Thus, a latitude of modification or change is intended in the foregoing disclosure. It is therefore appropriate that the invention be construed broadly and in a manner consistent with the true spirit and scope of the invention as sought to be defined by the following claims.

What I claim is:

1. In a process for the fabrication of a high DC current gain transistor, the improvement comprising the steps of providing a monocrystalline silicon wafer having a top surface and having formed therein an emitter region of one conductivity type, a base region of the opposite conductivity type from said emitter region, and a collector region of said one conductivity type, at least said emitter and base regions extending to said top surface, said emitter region being confined within said base region whereby a P-N junction is formed therebetween, forming a groove in said top surface so as to extend along said P-N junction, said groove having a depth less than the depth of said emitter region, forming a silicon oxide layer at least over said groove, and heating said wafer in a hydrogenous atmosphere.

2. The process of claim 1, wherein the depth of said groove is from about 1/10 to 4/5 the depth of said emitter region.

3. The process of claim 1, wherein said silicon oxide layer is formed by heating said wafer in an oxidative atmosphere.

4. The process of claim 1, wherein said silicon oxide layer has a thickness of from about 0.2 to 1.5 microns.

5. The process of claim 1, wherein said hydrogenous atmosphere contains at least about 20 percent of hydrogen gas.

6. The process of claim 1, wherein said wafer is heated in the hydrogen atmosphere to a temperature range of from about 300 to 1,000° C.

7. The process of claim 1, wherein said base region is formed by diffusing a first impurity substance into said wafer from said top surface, and wherein said emitter region is formed by diffusing a second impurity substance into said base region.

8. The process of claim 1, wherein said base region is formed by diffusing an impurity substance into said wafer from said top surface, and wherein said base region includes a low-resistance portion formed also by diffusing said impurity substance from said top surface, said low-resistance portion having a higher concentration of said impurity substance than the rest of said base region.

9. The process of claim 8, wherein said low-resistance portion of said base region is formed to a predetermined depth from said top surface so as to directly surround said emitter region whereby the P-N junction is formed therebetwen, the rest of said base region located away from said top surface, and wherein the depth of said groove is less than the depth of said low-resistance portion whereby part of said P-N junction is left under said groove.

10. The process of claim 1, wherein said base region is constituted of the silicon of which said wafer is made.

11. The process of claim 10, wherein said base region includes a low-resistance portion of relatively high impurity concentration formed by diffusing an impurity substance therein.

12. The process of claim 11, wherein said low-resistance portion of said base region is formed to a predetermined depth from said top surface so as to directly surround said emitter region whereby the P-N junction is formed therebetween, the rest of said base region being located away from said top surface, and wherein the depth of said groove is less than the depth of said low-resistance portion whereby part of said P-N junction is left under said groove.

13. In a process for the fabrication of a high DC current gain transistor, the improvement comprising the steps of providing a monocrystalline silicon wafer having a top surface and having formed therein a collector region of one conductivity type, diffusing a first impurity substance into said wafer from said top surface to a predetermined depth to form a base region of the opposite conductivity type from said collector region, diffusing a second impurity substance into said waffer from said top surface to form within said base region a relatively shallow emitter region of said one conductivity type having a depth considerably less than said depth of said base region, diffusing said first impurity substance into said wafer from said top surface to form a relatively shallow low-resistance base portion of said opposite conductivity type having a depth considerably less than said depth of said base region, said shallow low-resistance base portion directly surrounding said shallow emitter region whereby a P-N junction is formed therebetween, the concentration of said first impurity substance being made higher in said shallow low-resistance base portion than in said base region only to such an extent that no layer of said opposite conductivity type is formed in said shallow emitter region, forming a groove in said top surface so as to extend along said P-N junction, said groove having a depth less than said depth of said base region, forming a silicon oxide layer at least over said groove, causing said shallow emitter region and said shallow low-resistance base portion to increase in depth to predetermined degrees greater than said depth of said groove, and heating said wafer in a hydrogenous atmosphere.

* * * * *

UNITED STATES PATENT OFFICE
CERTIFICATE OF CORRECTION

Patent No. 3,943,014          Dated March 9, 1976

Inventor(s) Yutaka Yoshizawa

It is certified that error appears in the above-identified patent and that said Letters Patent are hereby corrected as shown below:

Column 15, line 49, in claim 6 the word "hydrogen" should read --hydrogenous--.

Signed and Sealed this

First Day of February 1977

[SEAL]

*Attest:*

RUTH C. MASON
*Attesting Officer*

C. MARSHALL DANN
*Commissioner of Patents and Trademarks*